United States Patent [19]
Lewis

[11] 4,398,116
[45] Aug. 9, 1983

[54] TRANSDUCER FOR ELECTRONIC FOCAL SCANNING IN AN ULTRASOUND IMAGING DEVICE

[75] Inventor: George K. Lewis, San Jose, Calif.

[73] Assignee: Siemens Gammasonics, Inc., Des Plaines, Ill.

[21] Appl. No.: 258,883

[22] Filed: Apr. 30, 1981

[51] Int. Cl.[3] .......... H01L 41/08

[52] U.S. Cl. .......... 310/334; 310/337; 310/367

[58] Field of Search .......... 310/366, 367, 368, 369, 310/334, 336, 337; 367/153, 155, 164, 180

[56] References Cited

U.S. PATENT DOCUMENTS 3,470,394 9/1969 Cook et al. .......... 310/367 X
3,496,617 2/1970 Cook et al. .......... 310/367 X
3,718,898 2/1973 Cook et al. .......... 310/367 X
3,924,259 12/1975 Butler et al. .......... 310/367 X
4,051,455 9/1977 Fowler .......... 310/337 X
4,211,948 7/1980 Smith et al. .......... 310/334 X
4,268,912 5/1981 Congdon .......... 310/337 X
4,305,014 12/1981 Borburgh et al. .......... 310/367 X

*Primary Examiner*—Mark O. Budd
*Attorney, Agent, or Firm*—Karl F. Milde, Jr.

[57] ABSTRACT

The ultrasonic transducer contains a plurality of adjacently positioned piezoelectric segments which are arranged concentrically. Each of the segments contains a number of linear parallel grooves, whereby these grooves define spaced surface areas therebetween. Each of the surface areas comprises respectively a piezoelectric element. The individual grooves are approximately annular when the segments are assembled. They decouple the piezoelectric elements acoustically from each other. Preferably, the segments each have a triangular shape.

14 Claims, 8 Drawing Figures

| ELEMENT NO. | t1 | t2 | t3 | t4 | t5 | t6 |
|---|---|---|---|---|---|---|
| 26a | X | | | | | |
| 26b | X | | | | | |
| 26c | X | | | | | |
| 26d | X | | | | | |
| 26e | X | X | | | | |
| 26f | X | X | | | | |
| 26g | X | X | | | | |
| 26h | | X | X | | | |
| 26i | | X | X | | | |
| 26j | | X | X | | | |
| 26k | | | X | X | | |
| 26l | | | X | X | | |
| 26m | | | | X | X | |
| 26n | | | | X | X | |
| 26o | | | | | X | X |
| 26p | | | | | | X |

TRANSDUCER FOR ELECTRONIC FOCAL SCANNING IN AN ULTRASOUND IMAGING DEVICE

BACKGROUND OF THE INVENTION

1. Field of the Invention

This invention relates to an ultrasound imaging device. More particularly, this invention relates to an ultrasonic transducer for electronic focal scanning in an ultrasound imaging device. Still more particularly, this invention relates to a transducer which contains a number of piezoelectric elements which are arranged around a central axis and which are spaced from each other by grooves for decoupling purposes.

2. Description of the Prior Art

In the prior art (see, for instance, article "Annular Array Design and Logarithmic Processing For Ultrasonic Imaging" by H. E. Melton, Jr. and F. L. Thurstone in Ultrasound Med. Biol., Vol. 4, pp. 1-12), a transducer for electronic focal scanning is disclosed which contains an annular array of piezoelectric elements. Each of the piezoelectric rings is provided with electrodes in order to apply a voltage thereto in the emission mode and to derive a voltage therefrom in the receiving mode. The prior art annular array is provided with several grooves separating the individual rings from each other, thereby acoustically decoupling adjacent areas from each other.

For dynamic focusing in the B mode imager, for instance, such an annular transducer may be employed. The different annuli are switched in one after the other, and the transducer is focused at various positions along the imaging space. One of the problems associated with the prior art focal scanning device resides in the fact that annular arrays, particularly annular grooves are difficult to implement. Usually, a special sawing tool such as a core drill is necessary for each individual groove. Therefore, a variety of tools are required in the production of such a device. For any design change, again special tooling is needed. Furthermore, the individual grooves are relatively wide. This leads to a lack of sensitivity and will create grating lobes in the emission mode as well as in the receiving mode, which in turn will contribute to poor imaging performance. Additionally, wide grooves represent a waste of active area which could be used for emission and/or receiving. Finally, in the prior art design having annular elements, it is hard to produce very fine elements, that is elements of small thickness. In the prior art producing process, the tool is pressed against the surface of a piezoelectric ceramic applying pressure to the brittle plate. This presents a certain hazard of breaking. Fine elements are needed for high frequencies.

SUMMARY OF THE INVENTION

1. Objects

It is an object of this invention to provide a transducer for electronic focal scanning in an ultrasound imaging device which can easily be manufactured.

It is still another object of this invention to provide a transducer such that one tool can be used in the production of annularly shaped elements of various sizes.

It is still another object of this invention to provide an ultrasonic transducer having comparatively small grooves.

It is still another object of this invention to design a transducer such that narrow annularly shaped elements may be produced.

It is still another object of this invention to provide a transducer which has relatively thin annularly shaped elements determined for relatively high frequencies.

2. Summary

According to this invention, a transducer for electronic focal scanning in an ultrasound imaging device is provided wherein a number of piezoelectric elements is arranged concentrically around a central axis. The elements are acoustically decoupled from each other by grooves. The transducer is comprised of a plurality of piezoelectric segments. Each segment contains a number of linear grooves which are arranged parallel to each other. The surface areas between the grooves form portions of the aforementioned elements.

The individual segments are positioned next to each other such that the surface areas form the piezoelectric elements and that the individual grooves together form polyhedral grooves which approximate annular grooves.

Thus, the annular array of the prior art is approximated by means of sections or segments of piezoelectric material which are preferably "pie-shaped". The individual sections or segments can be diced very accurately using a dicing saw. This eases the fabrication of the "rings". There is required just one tool, namely one dicing saw, for manufacturing "rings" of various diameters. It is possible to produce fine elements, that is thin "rings" with minimum space inbetween.

In some instances it may be sufficient to use 6 segments. If a closer approximation to an annular array is desired, more "pie structures" or segments may be provided.

The foregoing and other objects, features and advantages of the invention will be apparent from the following more particular description of preferred embodiments of the invention, as illustrated in the accompanying drawings.

DETAILED DESCRIPTION OF THE PREFERRED EMBODIMENTS

Figure 1:
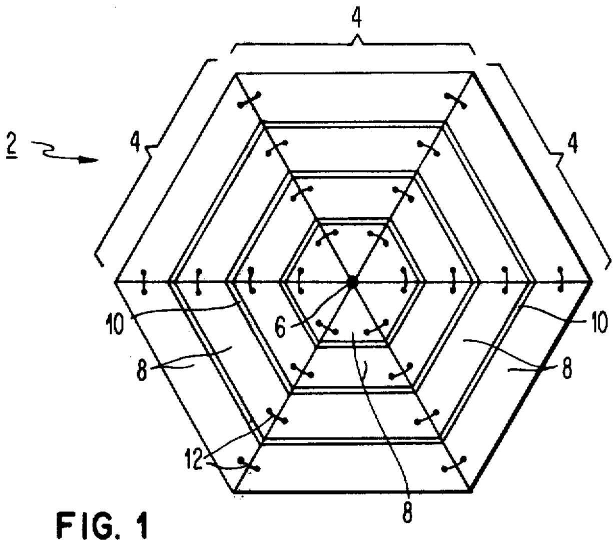
FIG. 1 is a plan view of a segmented ultrasonic transducer according to this invention, which transducer is composed of finely diced elongated piezoelectric pieces that are grouped to form approximate rings.

According to FIG. 1, an ultrasonic transducer 2 for electronic scanning comprises six triangular sections or segments 4 of identical shape which are concentrically arranged around a central axis 6. The linear sides of each segment 4 form an angle of 60° with each other. Each of the segments 4 contains four elongated elevated areas or pieces 8 which are separated from each other by linear grooves 10 which are arranged parallel to each other. The linear grooves 10 acoustically decouple the pieces 8 from each other. The grooves 10 may be easily fabricated by means of a dicing saw. Corresponding pieces 8 of all individual segments 4 form elements of polyhedral shape or "rings", that is polygons which approximate the ring form. The individual grooves 10 form three polyhedral grooves which approximate three annular grooves. The "annular" grooves are provided for acoustically decoupling adjacent elements. Adjacent elements 8 are electrically connected to each other by means of connectors or jumpers 12. Only two of these jumpers 12 are designated in FIG. 1 for the sake of clarity. All segments 4 have the same thickness. Thus, the illustrated transducer 2 is determined for emitting and receiving a predetermined ultrasound frequency.

Any one of the segments 4 may be diced to obtain grooves 10 with a precision down to, for instance, 0.5 mils (1 mil=0.001 inch) and with a small kerf between the pieces 8, for instance, with 1.5 mils cut between the "rings". The width of each "ring" may be, for instance, 1 mm, depending on the requirements of the ultrasound imaging device.

Figure 2:
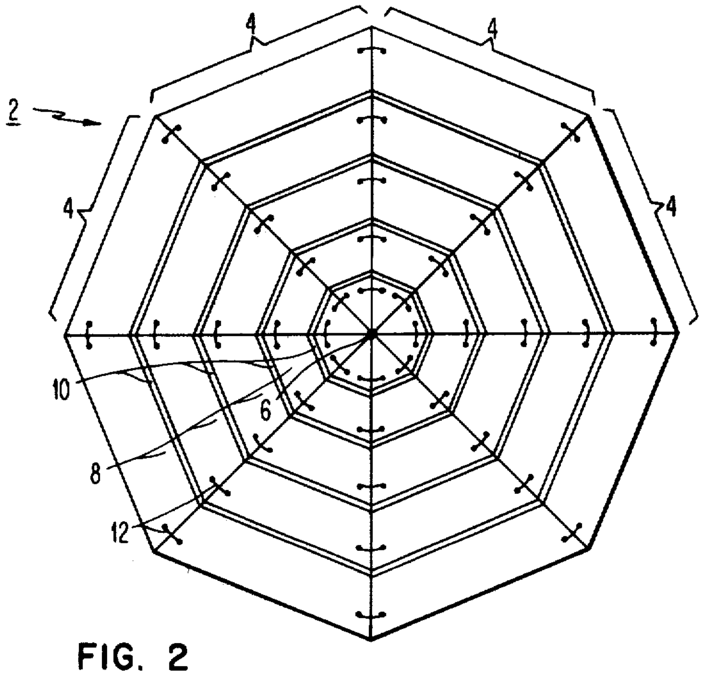
FIG. 2 is a plan view of another embodiment of a segmented transducer according to this invention.

In FIG. 2 a closer approximation to a circular transducer array is illustrated. In this embodiment, eight triangular segments 4 are used. Each of these segments 4 contains four linear grooves 10 which are arranged parallel to each other and all of which have the same width. Thus, five approximated "rings" are formed which are switched in or actuated one after the other in emission. Again, a symmetrical arrangement is chosen. Each of the segments 4 has two linear sides which are provided for positioning the segments 4 close to each other.

Basically any number of segments 4 may be chosen which allows for an easy production and a convenient arrangement. It has been found, however, that in some instances an even number of segments 4 may be of advantage.

The number of surface areas 8 may be preferably between four and ten, although other numbers may also be selected.

Figure 3:
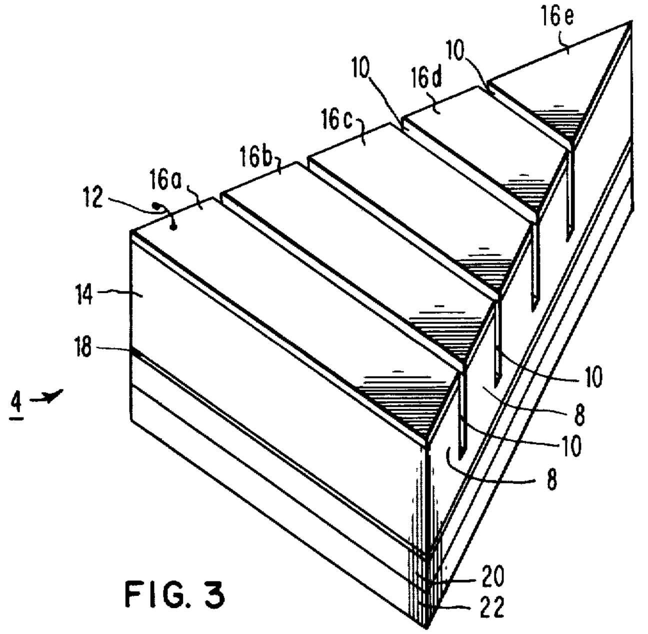
FIG. 3 is an isometric view of a segment of a transducer according to this invention.

FIG. 3 is a perspective view of one of the "pie-shaped" segments 4. The illustrated segment 4 basically contains a triangular or "pie-shaped" plate 14 of piezoelectric material, particularly of piezoelectric ceramic. The thickness of this plate 14 is preferably selected to be $\lambda/2$, wherein $\lambda$ is the wavelength of the ultrasound wave in this particular material at a given frequency. It will be noted that in FIG. 3 electrodes **16*a*, 16*b*, 16*c*, 16*d*, 16*e* are provided on the upper surface of the plate 14. These electrodes 16*a*–16*e* consist of a thin layer of metal. There is also provided a common electrode 18 on the lower surface of the plate 14. This electrode 18 is common for all individual elements of a segment 4** and electrically connected thereto.

In FIG. 3 are provided five elevated pieces or areas 8 which are separated from each other by four linear grooves 10. These grooves 10 are produced by dicing the coated ceramic plate 14 with a linear dicing saw. Therefore, the individual piezoelectric pieces 8 and the individual electrodes **16*a*–16*e* can be fabricated very easily. The grooves 10 extend to at least three quarters of the way through the piezoelectric ceramic plate 14 in order to provide a good acoustic decoupling. Basically, these grooves 10 could extend all the way through the ceramic material. However, in such a case the common electrode 18** would be destroyed.

As can be seen in FIG. 3, on the lower end of the segment 4 there are provided two matching layers 20 and 22. These matching layers 20 and 22 provide for a good acoustic coupling from the piezoelectric ceramic plate 14 to the body of a patient (not shown). Preferably, each of these matching layers 20 and 22 is $\lambda/4$ thick, wherein $\lambda$ is the wavelength of the ultrasound in the respective matching layer material. The lower matching layer 22 may engage the patient to be examined.

In FIG. 3 is illustrated that each segment 4 of the ultrasonic transducer has a triangular form which may be called a pie-structure. A multitude of these pie-structures, for instance, six or more, may be assembled to form the transducer according to FIG. 1, whereby the individual "rings" are each formed by adjacent piezoelectric pieces 8.

Figure 4:
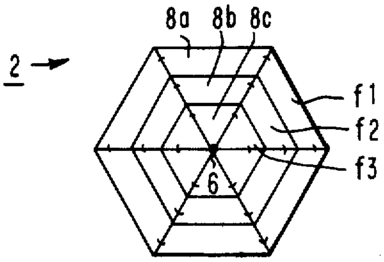
FIG. 4 is a plan view of a transducer according to this invention, illustrating that individual elements are provided for respective different frequencies.

In FIG. 4 is illustrated that an ultrasonic transducer 2 may have individual "rings" which are provided for emitting or receiving frequencies $f_1$, $f_2$, $f_3$, which frequencies $f_1$, $f_2$, $f_3$ are different from each other. According to these frequencies $f_1$, $f_2$, $f_3$ the individual piezoelectric "rings" each have a thickness $\lambda_1/2$, $\lambda_2/2$ and $\lambda_3/2$, respectively, wherein $\lambda_1$, $\lambda_2$, $\lambda_3$ is the wavelength of ultrasound of the the given frequency $f_1$, $f_2$, $f_3$, respectively, in the piezoelectric material. In other words, there may be provided "rings" of different thickness.

Figure 5:
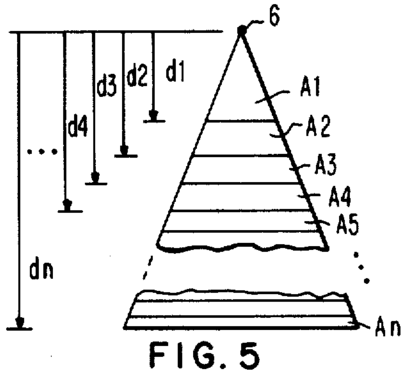
FIG. 5 is a plan view of a transducer segment wherein all individual piezoelectric pieces have the same area.

According to FIG. 5, it is of advantage to provide on each segment 4 separated areas $A_1$, $A_2$, $A_3$, . . . $A_n$ which all have the same size ($A_1 = A_2 = \ldots A_n$). In this case, the individual "rings" have all the same sensitivity. It has been found that the distance $d_n$ of the element n from the central axis 6 should be chosen such that $$d_n = \sqrt{n}\, d_1$$

wherein n is the number of the respective element and $d_1$ is the distance of the base line of the first element from the central axis 6. In other words, this equation gives the distance of dicing to maintain areas $A_2$, $A_3$ . . . in the trapezoidal sections which are equal to the triangular section having the area $A_1$.

Figure 6:
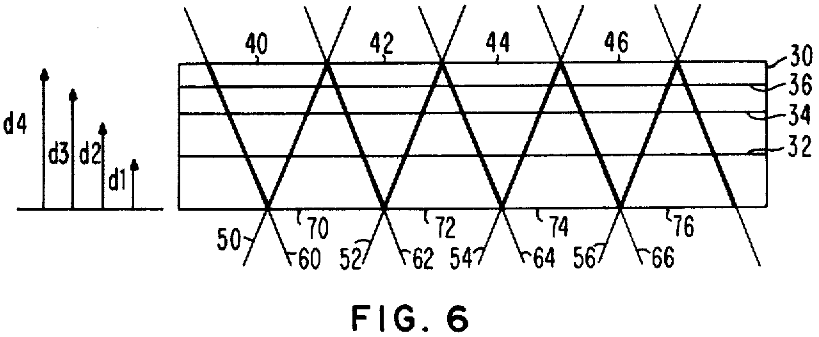
FIG. 6 is a plan view of a transducer plate indicating various dicing lines.

In FIG. 6 a fabrication process of an "annular" transducer 2 from a rectangular ceramic plate 30 is illustrated. The rectangular ceramic plate 30 is first diced in its longitudinal direction to form three grooves 32, 34, 36. In other words, the first groove 32 is machined in a distance $d_1$ from the lower border of the ceramic plate 30. Subsequently the next groove 34 is machined into the ceramic 30, this groove 34 having the distance $d_2$ from the lower border.

After all longitudinal grooves have been diced, four individual segments 40, 42, 44, 46 are cut out. For this purpose, four slicing cuts 50, 52, 54 and 56 are diced by a linear saw in succession, slicing also through the plate 30, to form one side each of triangular segments 40, 42, 44, 46. Subsequently, four more slicing cuts 60, 62, 64 and 66 are diced at a 60° angle for instance, to form the other side of triangular segments 40, 42, 44, 46. After this last process has been finished, the four segments 40, 42, 44 and 46 are removed for assembly in an annular transducer. The other triangular segments or pieces may be scrapped; however, if the grooves 32, 34 and 36 are equally spaced, the four lower triangular segments 70, 72, 74, 76 can be used as well.

Figures 7, 8:
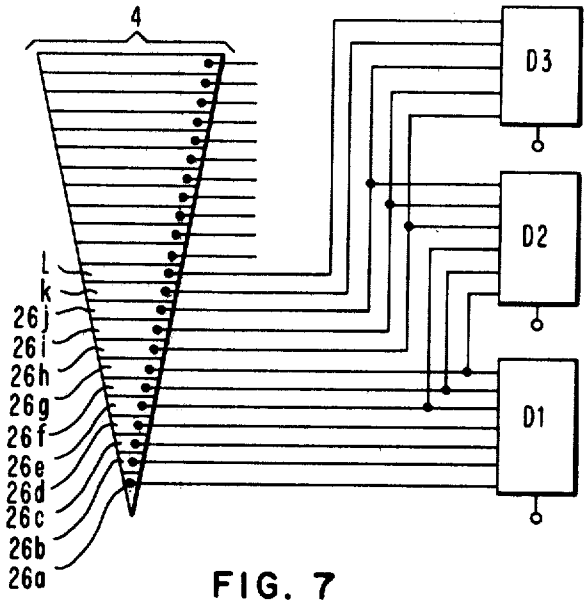
FIG. 7 is a plan view of a finely diced segment wherein the individual piezoelectric pieces are electrically controlled in an overlap mode.
FIG. 8 is a table which represents the overlap mode of the structure shown in FIG. 7.

In FIG. 7 is illustrated a top view of a segment 4 wherein the individual areas 8 are finely spaced. As can be seen, the whole surface of the triangular segment 4 is divided into a large number of small elongated areas 8. The individual electrode *26a*, *26b*, *26c*, . . . of each of these areas 8 is connected to a lead. As can be seen from table 8, freely selected groups of areas 8 may be controlled in an overlapping mode. At a certain time t1, the electrodes *26a–26g* are in the receiving mode so that they are currently connected to a delay line D1 for electronic focusing. In the next point of time t2, the electrodes *26e–26j* are electronically connected to a second delay line D2. It will be noted that the elements *26e* to *26g* are connected to delay lines D1 and D2 at the point of time t1 as well as at the point of time t2. In the next point of time t3 the elements *26h–26l* are electronically connected to a third delay line D3. Again, three elements *26h–26j* are active in both points of time t2 and t3. This overlapping mode is continued until the last of the small electrodes 26 is reached.

While the forms of the transducer for electronic focal scanning in an ultrasound imaging device herein described constitute preferred embodiments of the invention, it is to be understood that the invention is not limited to these precise forms of assembly, and that a variety of changes may be made therein without departing from the scope of the invention.

What is claimed is:

1. An ultrasound transducer for electronic focal scanning comprising:
   (a) a plurality of adjacently positioned piezoelectric segments arranged concentrically,
   (b) each of said segments containing a plurality of individual, linear parallel grooves,
   (c) said individual grooves in each segment defining spaced surface areas therebetween, and each of said surface areas comprising respectively a piezoelectric element, and
   (d) said individual grooves in the concentric arrangement of said segments form concentric polyhedral grooves which are approximately annular and acoustically decouple said piezoelectric elements from each other, which piezoelectric elements thereby forming polygons which approximate a ring form.

2. The improvement according to claim 1, wherein each of said segments has two linear sides for positioning said segments close to each other.

3. The improvement according to claim 1, wherein said segments are triangular segments which are arranged symmetrically around said central axis.

4. The improvement according to claim 3, wherein an even number of segments is provided.

5. The improvement according to claim 4, wherein six segments are provided, each segment having two linear sides which form an angle of 60° with each other.

6. The improvement according to claim 1, wherein between four and ten elevated piezoelectric areas are provided in each segment.

7. The improvement according to claim 1, wherein said elements are equally spaced from each other by said grooves.

8. The improvement according to claim 1, wherein said linear grooves extend through approximately $\frac{3}{4}$ of the thickness of said segments.

9. The improvement according to claim 1, wherein all said segments are alike.

10. The improvement according to claim 1, wherein each of said segments has a first surface and a second surface which second surface is parallel to said first surface, wherein said grooves are provided in said first surface, wherein said second surface is provided with a common electrode which is electrically connected to the corresponding common electrodes of all other segments, and wherein said surface areas of said first surface are electrically connected to the corresponding surface areas of the adjacent segments.

11. The improvement according to claim 1, wherein said common electrode is provided with at least one acoustically matching layer.

12. The improvement according to claim 1, wherein at least two of said elements respond to respective different ultrasonic frequencies.

13. The improvement according to claim 1, wherein said surface areas of each segment have the same size.

14. An ultrasound transducer for electronic focal scanning comprising:
   (a) a plurality of adjacently positioned piezoelectric segments arranged concentrically,
   (b) each of said segments containing a plurality of linear parallel grooves, said grooves defining spaced surface areas therebetween, and each of said surface areas comprising respectively a piezoelectric element, whereby said grooves are approximately annular and acoustically decouple said piezoelectric elements from each other; and
   (c) said surface areas of each segment have the same size, wherein the distance $d_n$ of the $n^{th}$ surface area from said central axis is determined according to $$d_n = \sqrt{n}\, d_1,$$

wherein $d_1$ is the distance of the outer perimeter of the innermost element from said central axis.

* * * * *